United States Patent
Kim et al.

(10) Patent No.: US 7,587,653 B2
(45) Date of Patent: Sep. 8, 2009

(54) DECODING METHOD FOR DETECTING PLSC FROM FRAMES OF SATELLITE BROADCASTING SYSTEM

(75) Inventors: Pan-Soo Kim, Daejon (KR); Dae-Ig Chang, Daejon (KR); In-Ki Lee, Busan (KR); Tae-Hoon Kim, Seoul (KR); Deock-Gil Oh, Daejon (KR); Wonjin Sung, Seoul (KR); Seokheon Kang, Seoul (KR); Deokchang Kang, Seoul (KR)

(73) Assignee: Electronics and Telecommunications Research Institute, Daejeon (KR)

(*) Notice: Subject to any disclaimer, the term of this patent is extended or adjusted under 35 U.S.C. 154(b) by 645 days.

(21) Appl. No.: 11/442,363

(22) Filed: May 26, 2006

(65) Prior Publication Data

US 2007/0150796 A1 Jun. 28, 2007

(30) Foreign Application Priority Data

Dec. 9, 2005 (KR) ........................ 10-2005-0121173

(51) Int. Cl.
*H03M 13/05* (2006.01)
(52) U.S. Cl. ..................................... 714/752
(58) Field of Classification Search ............. 714/752
See application file for complete search history.

(56) References Cited

U.S. PATENT DOCUMENTS

| | | | |
|---|---|---|---|
| 6,279,132 B1 * | 8/2001 | Linsky et al. | ........... 714/755 |
| 6,868,452 B1 | 3/2005 | Eager et al. | |
| 6,956,924 B2 * | 10/2005 | Linsky et al. | ........... 375/376 |
| 2003/0176195 A1 | 9/2003 | Dick et al. | |
| 2004/0252725 A1 | 12/2004 | Sun et al. | |

FOREIGN PATENT DOCUMENTS

WO  WO 02/065720  8/2002

OTHER PUBLICATIONS

Stephen B. Wicker, "Error Control Systems For Digital Communication And Storage", Prentice Hall International Editions, pp. 149-173, 1995.

Pansoo Kim et al., "Advanced Demodulator Implementation for DVB-S2 System" 2005 Joint Conference on Satellite Communications (JC-SAT 2005), Oct. 13-14, 2005, pp. 101-108, The Institute of Electronics, Information and Communication Engineers, IEICE Technical Report SAT2005—33(Oct. 2005).

* cited by examiner

*Primary Examiner*—Stephen M Baker
(74) *Attorney, Agent, or Firm*—Blakely, Sokoloff, Taylor & Zafman LLP

(57) ABSTRACT

Provided is a decoding method for detecting Physical Layer Signaling Codes (PLSCs) from frames of a satellite broadcasting system. The method includes: a) acquiring a summation vector and a subtraction vector from an inputted symbol vector; b) performing parallel Reed-Muller (32,6) decoding onto the summation and subtraction vectors based on a Hadamard matrix and estimating message bits of the summation and subtraction vectors; c) performing PLSC coding and modulation onto the message bits of the summation and subtraction vectors; d) calculating a first difference between symbols of the received symbol vector and the summation vector symbols, and a second difference between the symbols of the received symbol vector and the subtraction vector symbols; and e) when the first difference is smaller than the second difference, determining a Reed-Muller codeword is repeated, or when the first difference is larger than the second difference, determining that the Reed-Muller codeword is inverted.

7 Claims, 4 Drawing Sheets

$$G_{6\times32} = \begin{bmatrix} 0101010101 & 0101010101 & 0101010101 & 01 \\ 0011001100 & 1100110011 & 0011001100 & 11 \\ 0000111100 & 0011110000 & 1111000011 & 11 \\ 0000000011 & 1111110000 & 0000111111 & 11 \\ 0000000000 & 0000001111 & 1111111111 & 11 \\ 1111111111 & 1111111111 & 1111111111 & 11 \end{bmatrix}$$

US 7,587,653 B2

DECODING METHOD FOR DETECTING PLSC FROM FRAMES OF SATELLITE BROADCASTING SYSTEM

FIELD OF THE INVENTION

The present invention relates to a method for efficiently decoding a data sequence, which includes transmission format combination information, based on forward error correction coding, to detect Physical Layer Signaling Codes (PLSC) from frames of a satellite broadcasting system. More particularly, it relates to a decoding method for precisely decoding a PLSC from the header of a Physical Layer frame (PL frame) in a Digital Video Broadcasting-Satellite version 2 (DVB-S2) system.

DESCRIPTION OF RELATED ART

Recently, an increasing number of communication systems adopt a multi-transmission format in which the data type, modulation and/or transmission rate are varied to satisfy demands for high-quality services and secure channel transmission capacity. In a multi-transmission format system, bits indicating combination information of multi-transmission format are coded, included in frames, and then transmitted. Thus, it is necessary for a receiver to acquire information on a transmission format to properly achieve demodulation. Generally, identification of transmission format is coded and information on the transmission format is determined through decoding.

The DVB-S2 uses PLSC which is formed of Reed-Muller codes. The PLSC of the DVB-S2 is a 64-bit codeword including information on a frame coding rate, a modulation scheme, a data bit number per frame, and presence of a pilot symbol.

Error correction codes applied to the PLSC are Reed-Muller (32,6) codes, and a 32-bit codeword created based on the Reed-Muller Encoder is repeated or inversed according to whether a frame has a pilot symbol. To decode the PLSC, it is required to efficiently determine the form of repetition or inversion and perform Reed-Muller decoding. Through the decision, the reliability of PLSC decoding should be improved to acquire information on a modulation scheme, a coding rate, the length of frame, and the presence of a pilot symbol.

To describe the Reed-Muller Encoding in detail, the Reed-Muller code is usually used in channel coding performed onto combinations of bits representing system transmission frame format information. A frame format transmitter of a DVB-S2 frame corresponds to 7 bits which include a modulation scheme, coding rate information (MODCOD) and type. Since the 7 bits includes information on a coding rate, a modulation scheme, the number of data bits per frame, and whether there is a pilot symbol, the PLSC decoding performance is a significant parameter that affects the general performance of the system.

A general method for decoding Reed-Muller codes is revealed in an article entitled "Error Control System for Digital Communication and Storage," by Stephen B. Wicker in *Prentice Hall*, $1^{st}$ edition, Jan. 15, 1995, pp. 149-174.

Generally, decoding is performed by using a Hadamard matrix and using majority logic. The decoding using the Hadamard matrix is superior to decoding using majority logic.

A frame format transmission information decoding is disclosed in International Publication No. WO 2002/65720 applied by the Qualcomm Incorporated, which is entitled "System and method for transmission format detection."

According to the technology, decoding is performed based on one or more available formants and reliability is improved by listing the available formats based on priority.

SUMMARY OF THE INVENTION

It is, therefore, an object of the present invention to provide a decoding method for detecting Physical Layer Signaling Code (PLSC) information from a frame of a satellite broadcasting system based on a property of PLSC of a Digital Video Broadcasting-Satellite version 2 (DVB-S2) system that the PLSCs are coded repeatedly or inversely every pair of symbols according to whether there is a pilot symbol or not. As the Reed-Muller codes are decoded in parallel for each repetition or inversion, all combinations of frame formats are decoded with high reliability.

Other objects and advantages of the present invention can be understood by the following description and becomes clear with reference to exemplary embodiments. Also, the objects and advantages of the present invention can be easily realized by the means as claimed and combinations thereof.

In accordance with one aspect of the present invention, there is provided a decoding method for detecting Physical Layer Signaling Code (PLSC) information from frames of a satellite broadcasting system, including the steps of: a) receiving a symbol vector and acquiring a summation vector and a subtraction vector from a pair of symbols of the received symbol vector; b) performing parallel Reed-Muller (32,6) decoding onto the summation vector and the subtraction vector based on a Hadamard matrix and estimating message bits of the summation vector and message bits of the subtraction vector; c) performing PLSC coding on the message bits of the summation vector and the message bits of the subtraction vector, and modulating the coded message bits of the summation vector and the coded message bits of the subtraction vector to produce summation vector symbols and subtraction vector symbols, respectively; d) calculating a first difference value between symbols of the received symbol vector and the summation vector symbols, and a second difference value between the symbols of the received symbol vector and the subtraction vector symbols, individually; and e) when the first difference value is smaller than the second difference value, determining that a Reed-Muller codeword is repeated, or when the first difference value is larger than the second difference value, determining that the Reed-Muller codeword is inverted.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
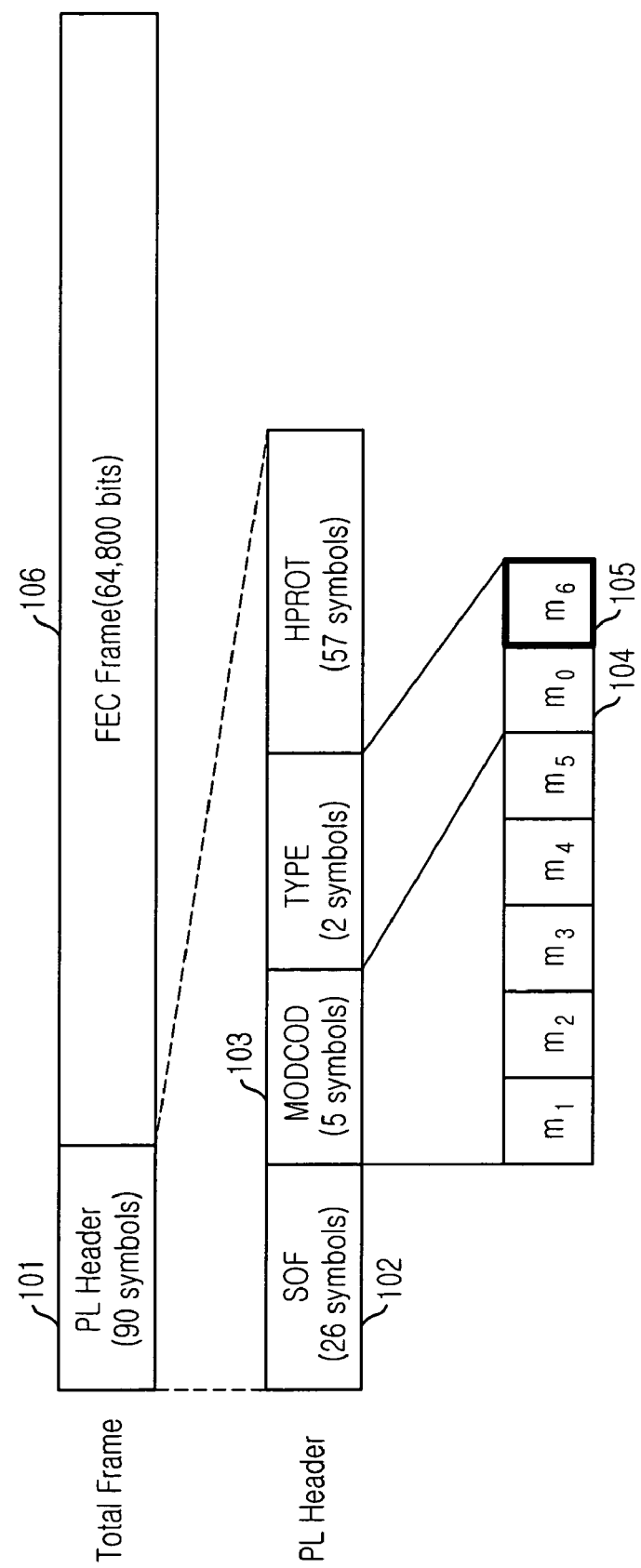
FIG. 1 is a diagram illustrating a frame of a general Digital Video Broadcasting-Satellite version 2 (DVB-S2) system.

FIG. 1 is a diagram illustrating a frame of a general Digital Video Broadcasting-Satellite version 2 (DVB-S2) system.

As shown in the drawing, the DVB-S2 frame is formed of a physical layer (PL) header 101 and a Forward Error Correction (FEC) frame 106. The PL header 101 includes a Start Of Frame (SOF) 102, a Modulation and Code (MODCOD) 103, a type, and an HPROT. As for the type, there are two types: a Most Significant Bit (MSB) 104 and a Least Significant Bit (LSB) 105.

The PLSC of a DVB-S2 frame occupies 64 bits among the 90-bit PL header 101 except the SOF 102 which notifies the starting point of a frame. It includes the 5-bit MODCOD 103, the one-bit MSB 104 and the one-bit LSB 105. The MODCOD 103 is formed of five bits and it includes information on a modulation scheme and a coding rate. The MSB 104 is a codeword which includes information on the number of bits per frame and the LSB 105 includes information on whether there is a pilot symbol or not. The PLSC is a codeword obtained by performing (64,7) coding on the 7 bits.

Figures 2, 3:
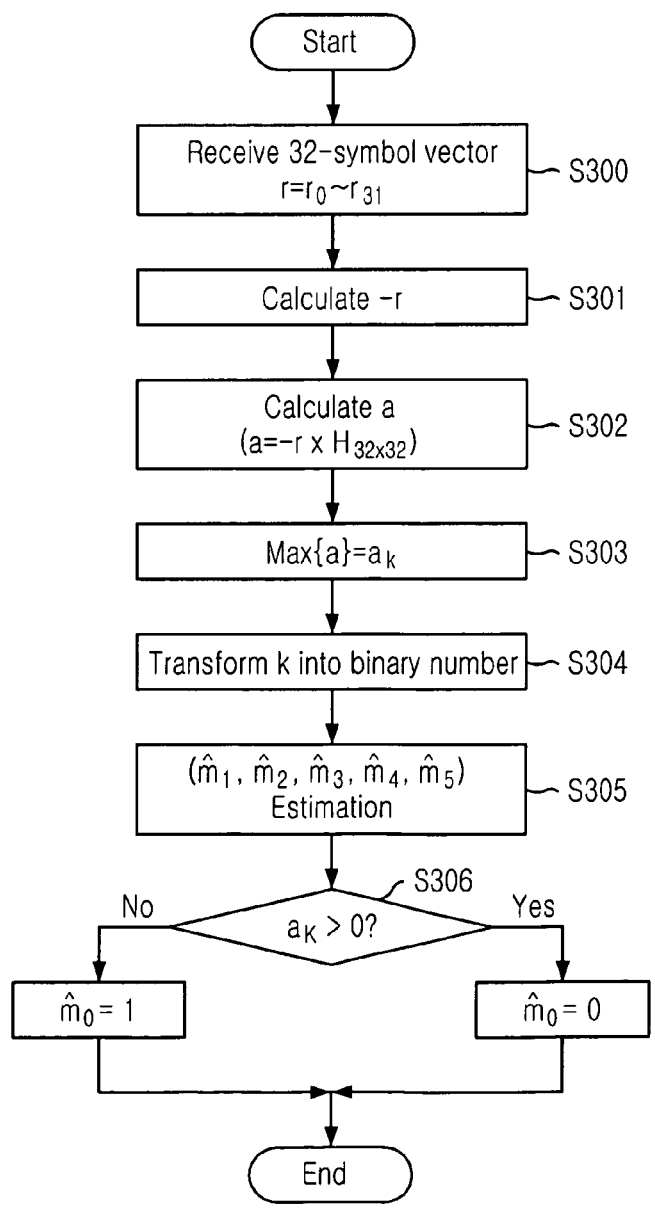
FIG. 2 is a view describing a Reed-Muller generator matrix used for a Physical Layer Signaling Code (PLSC) coding process in the general DVB-S2 system.
FIG. 3 is a flowchart describing a typical PLSC decoding process.

FIG. 2 is a view describing a Reed-Muller generator matrix used for a PLSC coding process in the general DVB-S2 system.

The PLSC coding process includes a process of performing Reed-Muller (32,6) coding on the 6 bits including the MODCOD 103 and the MSB 104 by using the Reed-Muller (32,6) generator matrix shown in FIG. 2, and a process of repeating or inverting the generated Reed-Muller (32,6) codeword according to the LSB 105.

The Reed-Muller (32,6) is expressed as Equation 1:

$$m \times G_{6 \times 32} = (c_0, c_1, \ldots, c_{30}, c_{31})$$ Eq. 1 wherein m denotes the 6 bits including the MODCOD 103 and the MSB 104, that is, $m_1, m_2, m_3, m_4, m_5$, and $m_6$; and $G_{6 \times 32}$ denotes a Reed-Muller generator matrix.

The Reed-Muller (32,6) codeword of the generated $c_0$ to $c_{31}$ is repeated or inverted in the LSB 105 as shown in Equation 2.

When the LSB 105 is '1,' it means that a pilot symbol exists within a frame. When the LSB 105 is '0,' it means that there is no pilot symbol within a frame.

LSB(105)=1=>

$(C_0, \overline{C}_0, C_1, \overline{C}_1, \ldots, C_{30}, \overline{C}_{30}, C_{31}, \overline{C}_{31})$

LSB(105)=0=>

$(C_0, C_0, C_1, C_1, \ldots, C_{30}, C_{30}, C_{31}, C_{31})$ Eq. 2

The PLSC of the DVB-S2 frame has a structure in which the 32-bit Reed-Muller codeword generated by the Reed-Muller (32,6) coding is repeated or inverted as shown in the Equation 2.

FIG. 3 is a flowchart describing a typical PLSC decoding process. It shows a typical Reed-Muller (32,6) decoding.

As shown in FIG. 3, when the 6 bits '$m_1, m_2, m_3, m_4, m_5$, and $m_6$' are coded in the Reed-Muller (32,6) coding method and then go through BPSK modulation before transmission, the typical Reed-Muller (32,6) decoding is performed by comparing correlations between the received 32 symbols and the closest codeword with each other based on a Hadamard matrix.

The decoding is performed as follows.

First, in step S301, each element of a reception vector r 300, which occupies 32 symbols, is multiplied by '−1' to calculate '−r.'

In step S302, a 32×32 Hadamard matrix is multiplied by the '−r' to calculate an 'a' vector, which is shown in Equation 3.

$$a = -r \times H_{32} = (a_0, a_1, \ldots, a_{30}, a_{31})$$ Eq. 3 wherein $H_{32}$ is the 32×32 Hadamard matrix. In step S303, the maximum value Max{a} where the magnitude of the value 'a' becomes the maximum, and it is expressed as Max{a}=$a_k$.

In step S304, the index k of the maximum value is transformed into a binary number and, in step S305, message bits '$m_1, m_2, m_3, m_4$, and $m_5$' are estimated.

Subsequently, in step S306, a value $\hat{m}_0$ is estimated, as the Max{a} value is a positive number or a negative number. In other words, when '$a_k$>0,' $\hat{m}_0$=0. When '$a_k$<0,' $\hat{m}_0$=0.

Through the process, the message bits $m_1, m_2, m_3, m_4, m_5$, and $m_6$ are decoded.

In the present invention, the Reed-Muller (32,6) decoding is performed in parallel, as the PLSC is repeated or inverted according to the LSB which indicates whether there is a pilot symbol or not.

The decoding will be described with reference to FIG. 4.

Figure 4:
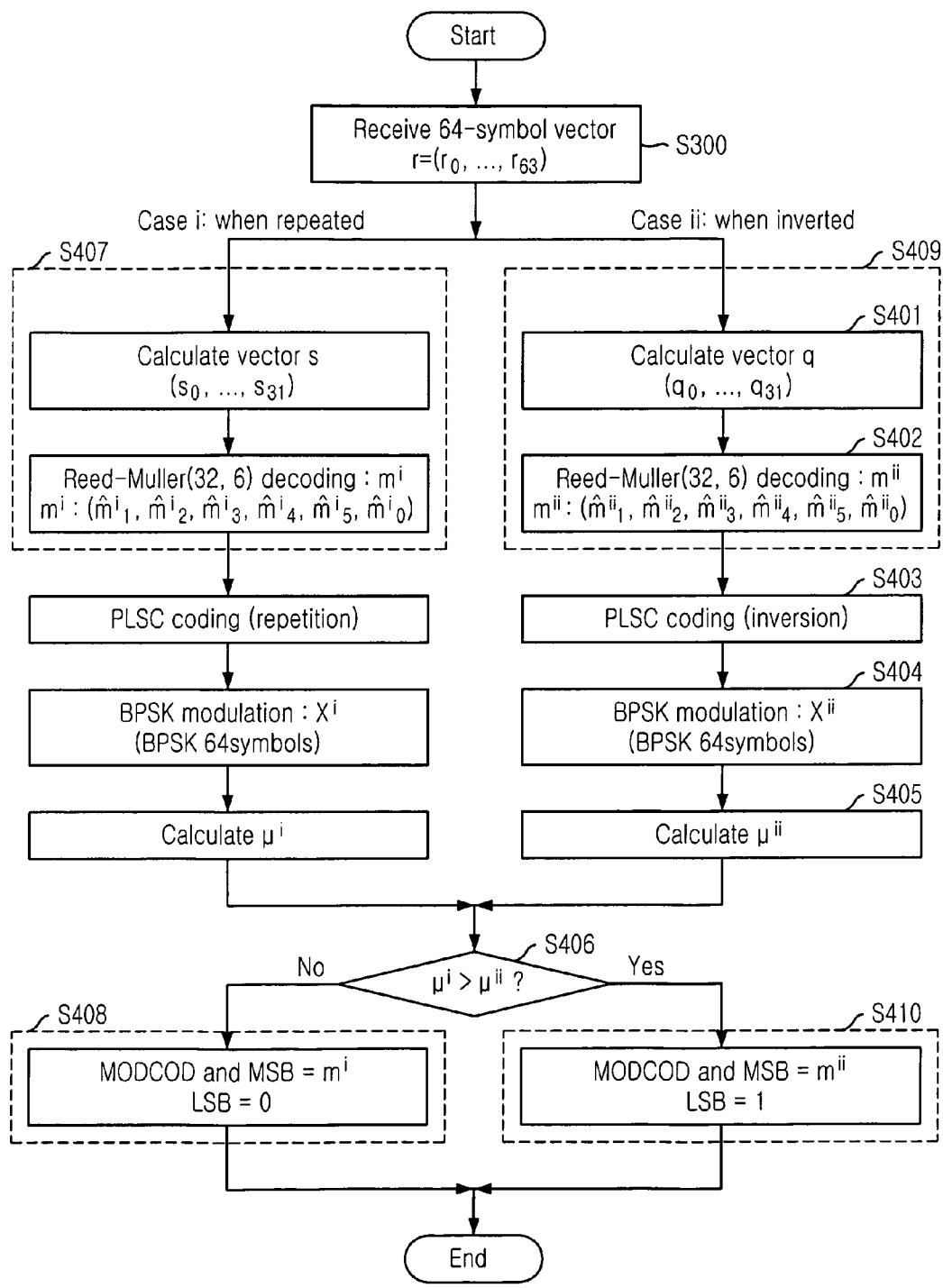
FIG. 4 is a flowchart illustrating a decoding method for detecting PLSC information from a satellite broadcasting frame in accordance with an embodiment of the present invention.

FIG. 4 is a flowchart illustrating a decoding method for detecting PLSC information from a satellite broadcasting frame in accordance with an embodiment of the present invention.

As shown in FIG. 4, the PLSC decoding is performed by calculating summation and difference for each symbol pair (S401), performing Reed-Muller (32,6) decoding (S402), performing PLSC coding (S403), performing BPSK modulation (S404), calculating distance to a reception symbol (S405), and determining repeated and inverted information (S406).

The step S401 of calculating the summation and difference between each symbol pair is shown as Equation 4 below.

Calculation of summation vector s32:

$$s_n = r_{2n} + r_{2n+1}, \ n=0\sim31$$

Calculation of subtraction vector q32:

$$q_n = r_{2n} - r_{2n+1}, \ n=0\sim31$$ Eq 4 where '$r_k$' denotes a received vector (k=0~63).

As shown in Equation 2, when the repeated or inverted PLSC is transmitted in the form of BPSK symbols, the summation vector s and the subtraction vector q can be calculated based on a 64-symbol reception symbol vector as shown in Equation 4. Herein, each vector s or q includes 32 symbols.

When a reception symbol r is repeated, the s vector is used. When repeated PLSC is transmitted through an idealistic channel where $E_s/N_0$ is infinite, the elements $s_0$ to $s_{31}$ of the s vector become 2 or −2. When a reception symbol r is inverted, the q vector is used. When the inverted PLSC is transmitted through an idealistic channel where $E_s/N_0$ is infinite, the elements $q_0$ to $q_{31}$ of the q vector become 2 or −2. When the s or q vectors is used for the case where the repeated or inverted PLSC is transmitted through the idealistic channel, the Reed-Muller (32,6) decoding can be performed with an improved reliability by using 32 symbols for the s or q vector having a value of 2 or −2, instead of using 64 symbols for a reception vector r having a value of 1 or −1.

When detection of a pilot symbol is not performed in advance, the s or q vector is used based on an assumption that repetition or inversion is performed with respect to the reception vector r, and the Reed-Muller (32,6) decoding is carried out in parallel in step S402. Then again, the distance to the reception vector r is compared in step S406 by using a symbol coded in step S403 and modulated in step S404 to determine whether the PLSC is repeated or inverted.

When a case where the PLSC is repeated is called a case i and a case where the PLSC is inverted is called a case ii, the process of FIG. 4 can be described as follows.

First, in step S401, a summation vector and a subtraction q are calculated for a symbol pair Z. Herein, when the case i where the PLSC is repeated is assumed, the summation vector s is calculated, or when the case ii where the PLSC is inverted is assumed, the subtraction vector q is calculated.

In step S402, the Reed-Muller (32,6) decoding is performed in parallel based on a Hadamard matrix and a 6-bit message bit $m^i$ or $m^{ii}$ is estimated. In short, in case of the case i, $m^i = (\hat{m}^i_1, \hat{m}^i_2, \hat{m}^i_3, \hat{m}^i_4, \hat{m}^i_5, \hat{m}^i_0)$. In case of the case ii, $m^{ii} = (\hat{m}^{ii}_1, \hat{m}^{ii}_2, \hat{m}^{ii}_3, \hat{m}^{ii}_4, \hat{m}^{ii}_5, \hat{m}^{ii}_0)$.

Subsequently, PLSC coding and BPSK modulation are carried out in the steps 403 and 404, respectively, by using the 6-bit message bit $m^i$ or $m^{ii}$. In short, a 64-bit BPSK symbol $X^i$ or $X^{ii}$ is generated. In case of the case i, the $X^i$ is a 64-bit BPSK symbol generated base don the assumption i. In case of the case ii, the $X^{ii}$ is a 64-bit BPSK symbol generated base don the assumption ii.

In step S405, a difference to the reception symbol r is calculated by using the $X^i$ or $X^{ii}$. In short, the difference is $$\mu^i = \sum_{n=0}^{63} (r_n - x_n^i)^2$$

in case of the assumption i, and the difference is $$\mu^{ii} = \sum_{n=0}^{63} (r_n - x_n^{ii})^2$$

in case of the assumption ii.

In step S406, the values $\mu^i$ and $\mu^{ii}$ are compared with each other.

When $\mu_i > \mu^{ii}$, it is determined that the assumption i is true and the $m^i$ occupies six bits including the MODCOD 103 and the MSB 104. The LSB 105 is determined to be '0.'

When $\mu^i > \mu^{ii}$, it is determined that the assumption ii is true and the $m^{ii}$ occupies six bits including the MODCOD 103 and the MSB 104. The LSB 105 is determined to be '1.'

Through the above process, seven bits including the MODCOD 103, which has general information on a transport frame, and the type 104 and 105 are decoded regardless of whether there is a pilot symbol or not.

Prior to the decoding process, frequency error estimation is carried out. The frequency error caused in a DVB-S2 system is ±5 MHz and this corresponds to 20% of the bandwidth, i.e., 25 MHz. Accordingly, frequency error needs to be estimated and corrected prior to the decoding.

To estimate the frequency error before the PLSC is decoded, it needs to detect whether there is a pilot symbol or not. When the pilot symbol detection is carried out before the frequency error estimation, it means that the repetition or inversion of the PLSC is already decided. Therefore, it is possible to improve reliability by using only one of the summation vector s and the subtraction vector q between reception symbols in the parallel decoding process shown in FIG. 4.

When no pilot symbol is detected in the process checking whether there is a pilot symbol or not, in step S407, decoding is performed based on only the summation vector s and it is determined that the LSB is '0.' Also, when it turns out that there is a pilot symbol, decoding is carried out based on only the subtraction vector q in step S409 and the LSB is determined to be '1' in step S410.

Also, since the decoding is performed based on one vector between the summation vector s and the subtraction vector and the LSB is decided to be '0' or '1,' it is possible to reduce computational quantity when the presence of the pilot symbol is determined prior to the decoding.

Figure 5:
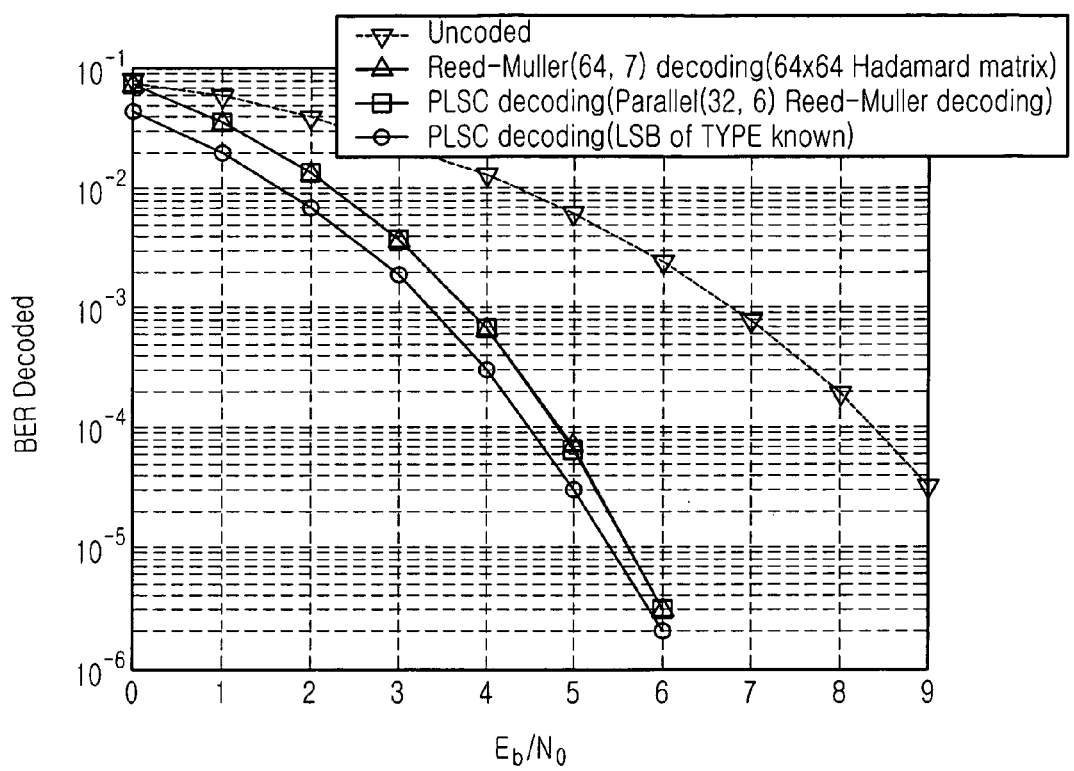
FIG. 5 is a graph showing performance analysis of the decoding method in accordance with the embodiment of the present invention.

FIG. 5 is a graph showing performance analysis of the decoding method in accordance with the embodiment of the present invention.

To be specific, general Reed-Muller (64,7) decoding based on the Hadamard matrix is compared with Parallel (32,6) Reed-Muller PLSC decoding based on PLSC repetition or inversion information without the pilot symbol detection prior to the decoding process, which is suggested in the present invention. It is also compared with the parallel PLSC decoding with LSB of type known based on the PLSC repletion or inversion information, which is also suggested in the present invention when the pilot symbol detection is carried out prior to the PLSC decoding. Then, the performances are compared by measuring Bit Error Rates (BER), a possibility where an error may occur among 7 bits.

The Parallel (32,6) Reed-Muller PLSC decoding of the present invention based on PLSC repetition or inversion information does not show any difference in performance from the performance of the general (64,7) Reed-Muller decoding. When the pilot symbol detection is carried out before the decoding and the LSB of the type is known, the decoding reliability is improved by using any one of the summation vector s or the subtraction vector q in the Equation 4.

The method of the present invention can be realized as a program and stored in a computer-readable recording medium, such as CD-ROM, RAM, ROM, floppy disks, hard disks, and magneto-optical disks. Since the process can be easily implemented by those skilled in the art of the present invention, further description on it will not be provided herein.

The present invention described above can improve reliability of Physical Layer Signaling Code (PLSC) decoding by performing Reed-Muller (32,6) decoding in parallel for each repetition or inversion, independently from the presence of a pilot symbol in a frame of a Digital Video Broadcasting-Satellite version 2 (DVB-S2) system, i.e., DVB-S2 frame. Also, when the presence of a pilot symbol is estimated, it is possible to improve decoding performance additionally and reduce a computational quantity.

The present application contains subject matter related to Korean patent application No. 2005-121173, filed in the Korean Intellectual Property Office on Dec. 9, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A decoding method for detecting Physical Layer Signaling Code (PLSC) information from frames of a satellite broadcasting system, comprising the steps of:
   a) receiving a symbol vector and acquiring a summation vector and a subtraction vector from a pair of symbols of the received symbol vector;
   b) performing parallel Reed-Muller (32,6) decoding onto the summation vector and the subtraction vector based on a Hadamard matrix and estimating message bits of the summation vector and message bits of the subtraction vector;
   c) performing PLSC coding on the message bits of the summation vector and the message bits of the subtraction vector, and modulating the coded message bits of the summation vector and the coded message bits of the subtraction vector to produce summation vector symbols and subtraction vector symbols, respectively;
   d) calculating a first difference value between symbols of the received symbol vector and the summation vector symbols, and a second difference value between the symbols of the received symbol vector and the subtraction vector symbols, individually; and
   e) when the first difference value is smaller than the second difference value, determining that a Reed-Muller codeword is repeated, or when the first difference value is larger than the second difference value, determining that the Reed-Muller codeword is inverted.

2. The decoding method as recited in claim 1, wherein, in the step a), when the Reed-Muller codeword is repeated and a received symbol r transmitted through an idealistic channel, Reed-Muller (32,6) decoding is performed with enhanced decoding reliability by using a 32-symbol summation vector which has a value of 2 or −2, instead of using a 64-symbol summation vector which has a value of 1 or −1.

3. The decoding method as recited in claim 1, wherein, in the step a), when the Reed-Muller codeword is inverted and a received symbol r transmitted through an idealistic channel, Reed-Muller (32,6) decoding is performed with enhanced decoding reliability by using a 32-symbol subtraction vector which has a value of 2 or −2, instead of using a 64-symbol subtraction vector which has a value of 1 or −1.

4. The decoding method as recited in claim 1, wherein, in the step e), when the Reed-Muller codeword is repeated, the message bits of the summation vector includes the MODCOD and the MSB and the LSB is determined to be '0.'

5. The decoding method as recited in claim 1, wherein, in the step e), when the Reed-Muller codeword is inverted, the message bits of the subtraction vector includes the MODCOD and the MSB and the LSB is determined to be '1.'

6. The decoding method as recited in claim 1, wherein when pilot symbol detection is carried out prior to the decoding and no pilot symbol is detected, the decoding is carried out by using the summation vector and the LSB is determined to be '0.'

7. The decoding method as recited in claim 1, wherein when pilot symbol detection is carried out prior to the decoding and there is a pilot symbol detected, the decoding is carried out by using the subtraction vector and the LSB is determined to be '1.'

* * * * *